United States Patent
Huang et al.

(10) Patent No.: US 12,484,334 B2
(45) Date of Patent: Nov. 25, 2025

(54) PHOTOVOLTAIC CELL MODULE AND MANUFACTURING METHOD THEREOF

(71) Applicant: CANDO-SOLARPHOTOELECTRIC TECHNOLOGY (CHANGZHOU) CO., LTD., Jiangsu (CN)

(72) Inventors: Pinru Huang, Jiangsu (CN); Yaolun Huang, Jiangsu (CN)

(73) Assignee: CANDO-SOLARPHOTOELECTRIC TECHNOLOGY (CHANGZHOU) CO., LTD., Jiangsu (CN)

( * ) Notice: Subject to any disclaimer, the term of this patent is extended or adjusted under 35 U.S.C. 154(b) by 7 days.

(21) Appl. No.: 17/882,394

(22) Filed: Aug. 5, 2022

(65) Prior Publication Data

US 2023/0178680 A1    Jun. 8, 2023

Related U.S. Application Data (63) Continuation-in-part of application No. PCT/CN2022/089209, filed on Apr. 26, 2022.

(30) Foreign Application Priority Data

Dec. 8, 2021   (CN) .......................... 202111492715.X (51) Int. Cl.
*H10F 71/00*   (2025.01)
*H02S 40/34*   (2014.01)
(Continued)

(52) U.S. Cl.
CPC ......... *H10F 71/1375* (2025.01); *H02S 40/34* (2014.12); *H10F 19/902* (2025.01); *H10F 77/937* (2025.01)

(58) Field of Classification Search
None
See application file for complete search history.

(56) References Cited

U.S. PATENT DOCUMENTS

| 2010/0224230 A1* | 9/2010 | Luch | H10F 19/31 |
| | | | 257/E31.001 |
| 2011/0197951 A1* | 8/2011 | Abiko | B23P 11/022 |
| | | | 136/246 |

(Continued)

FOREIGN PATENT DOCUMENTS

| CN | 106449796 A | 2/2017 |
| CN | 107492581 A | 12/2017 |

(Continued)

OTHER PUBLICATIONS

Machine translation of CN106449796A (Year: 2017).*

(Continued)

*Primary Examiner* — Ryan S Cannon
(74) *Attorney, Agent, or Firm* — BLANK ROME LLP (57) ABSTRACT

A photovoltaic cell module includes a photovoltaic cell layer, conductive or non-conductive connection points between photovoltaic cells and interconnected busbars, a grid line bonding layer and a grid line supporting layer provided on surfaces of the photovoltaic cells. The grid line supporting layer adheres to the surfaces of the photovoltaic cells by a bonding effect of the grid line bonding layer. The grid line supporting layer is laminated on the interconnected busbars. A method of manufacturing the module includes: firstly, preliminarily fixing interconnected busbars on the surfaces of photovoltaic cells via conductive or non-conductive connection points; then covering the surfaces of the photovoltaic cells with a grid line supporting layer and a grid line bonding layer, applying pressure on the grid line supporting layer and the grid line bonding layer, and completely fixing the interconnected busbars to the surfaces of the photovoltaic cells by the grid line supporting layer.

16 Claims, 6 Drawing Sheets

(51) Int. Cl.
    *H10F 19/90*         (2025.01)
    *H10F 77/00*         (2025.01)

(56) References Cited

U.S. PATENT DOCUMENTS

| | | | |
|---|---|---|---|
| 2012/0312358 A1* | 12/2012 | Yamashita | H01L 31/048 136/251 |
| 2015/0207003 A1* | 7/2015 | Woo | H10F 19/80 136/246 |
| 2016/0181454 A1* | 6/2016 | Son | H01L 31/0682 438/66 |
| 2018/0198008 A1 | 7/2018 | Tripp et al. | |
| 2018/0315875 A1 | 11/2018 | Gragert et al. | |

FOREIGN PATENT DOCUMENTS

| | | |
|---|---|---|
| CN | 108419433 A | 8/2018 |
| CN | 111403497 A | 7/2020 |

OTHER PUBLICATIONS

Machine translation of CN111403497A (Year: 2020).*
P.-C. Hsiao, et al., "Balanced Contact Method: Reduction of Thermomechanical Stress in Silicon Solar Cells Induced by Interconnection", Solar Energy Materials and Solar Cells, vol. 215; 2020; 110667; 10 pgs.

* cited by examiner

PHOTOVOLTAIC CELL MODULE AND MANUFACTURING METHOD THEREOF

RELATED APPLICATION

The present application is a continuation-in-part of International Application No. PCT/CN2022/089209 filed on Apr. 26, 2022, which claims priority to Chinese Patent Application No. 202111492715. x filed on Dec. 8, 2021, the disclosures of which are incorporated herein in their entirety by reference.

FIELD OF THE INVENTION

The present invention relates to the technical field of photovoltaics, and in particular to a photovoltaic cell module and a manufacturing method thereof.

DESCRIPTION OF THE PRIOR ART

In recent years, photovoltaic new energies have been applied and developed rapidly. Combined with energy storage, electric vehicle, and charging pile technologies, etc., a new mode will realize local consumption for photovoltaic power generation. Therefore, rooftop type and building integrated photovoltaics (BIPV) will become the next focus of photovoltaic applications.

Due to a limited application area of the rooftop type photovoltaics and BIPV, more efficient cells and modules are needed. Among the next-generation cells, the most promising new cells should be TOPCON and heterojunction cells. Among the next-generation module technologies, the most efficient module is the shingled module.

At present, all the three technologies have a problem of too high cost. Compared with a mainstream PREC technology, the consumption of Ag paste in heterojunction cells has increased by 150%, and the consumption of silver paste in TOPCON cells has increased by 50%. When these cells are packaged into modules with a shingle technology, the consumption of Ag paste will be further increased.

How to reduce the consumption of Ag paste is a core bottleneck of the development of the photovoltaic industry and the development of BIPV rooftop photovoltaics. It is the biggest challenge for the photovoltaic industry to reduce the consumption of Ag paste and make high-efficiency cell modules better and cheaper.

At present, the 9BB busbar photovoltaic cells commonly used in the industry consume less Ag paste than the 5BB busbar photovoltaic cells. This is because the 9BB busbar photovoltaic cells have more cell busbars, the current transmission distance between two cell busbars is large and the amplitude is reduced, so that the amount of Ag paste for cell fingers can be reduced. If this technical route is still adopted and the number of busbars continues to be increased, the amount of Ag paste for the cell fingers can be further reduced, but the amount of Ag paste for the cell busbars is increasing. In an electrical connection scheme of photovoltaic cells with busbars, the busbars of the cells are welded with welding strips, which has the functions of mechanical fixation and current conduction at the same time. Therefore, the total consumption of Ag paste cannot be further reduced.

In a busbarless photovoltaic cell technology, there is no cell busbar, which can save the amount of Ag paste for the cell busbar.

In the prior art, for busbarless photovoltaic cells, there are two electrical connection schemes. The first scheme is to provide Ag paste pads on the surfaces of the busbarless photovoltaic cells for welding multi-busbar welding strips with the busbarless photovoltaic cells.

Because of the thermal expansion and contraction phenomenon of the multi-busbar welding strips, during a cold and hot cycle from −40 degrees to 85 degrees, there will be a back-and-forth cutting effect on the surfaces of the photovoltaic cells, thereby wearing out Ag finger lines (such as TOPCON, HJT and PERC cells) or ITO conductive layers on textured surfaces of the cells (such as HJT cells), causing failure. Therefore, the number of pads should not be too small to ensure a reliable mechanical fixation between the welding strips and the photovoltaic cells.

Therefore, there is still a lot of Ag paste consumption for the pads in this first scheme of electrical connection of busbarless photovoltaic cells.

The second scheme is to realize electrical connection of busbarless photovoltaic cells by adhesive film electrodes with multi-busbar welding strips. There is no need to provide Ag paste pads on the surfaces of the busbarless photovoltaic cells, which further reduces the total Ag paste consumption of the photovoltaic modules.

Figure 12:
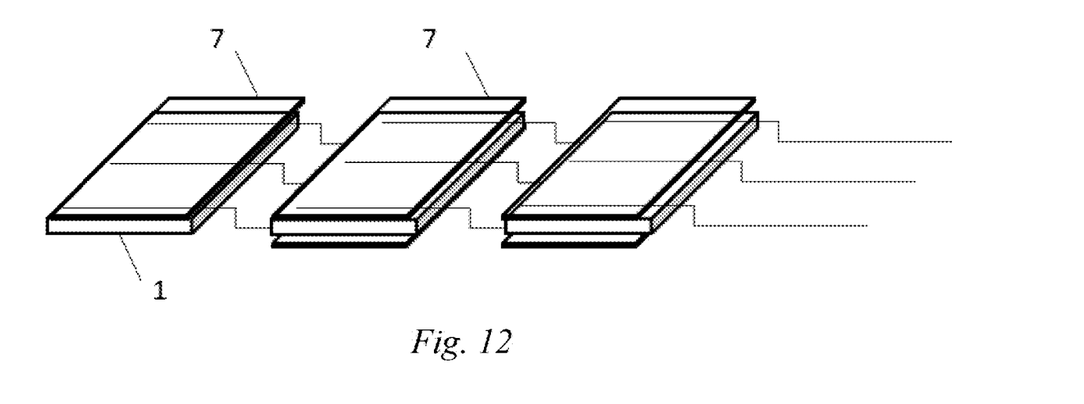
FIG. 12 is a schematic structural diagram showing that photovoltaic cells are connected in series by means of adhesive film electrodes with multi-busbar welding strips in the prior art.

The Chinese patent document No. CN108419433 of Meyer Burger Company, Switzerland discloses the second scheme of electrical connection of busbarless photovoltaic cells, in which the electrical connection between the multi-busbar welding strips and the busbarless photovoltaic cells is realized by the adhesive film electrodes. The adhesive film electrodes with the multi-busbar welding strips include a layer of adhesive film, and the multi-busbar welding strips adhere to and are embedded in the adhesive film. The adhesive film is then used to fix the multi-busbar welding strips to the surfaces of the cells to form good conductive contacts between the multi-busbar welding strips and the busbarless photovoltaic cells, as shown in FIG. 12.

The disadvantage of the second scheme of electrical connection of busbarless photovoltaic cells is in that: to fabricate this kind of adhesive film electrodes with the multi-busbar welding strips, it is necessary not only to combine the multi-busbar welding strips with the adhesive film together, but also to constantly adjust and flip the adhesive face of the adhesive film in a staggered manner, which leads to a high price of this kind of adhesive film electrodes with the multi-busbar welding strips. At the same time, the manufacturing cost of a photovoltaic module using the adhesive film electrodes with the multi-busbar welding strips is also high, and an actual effect of reducing module cost is limited.

In another aspect, in order to reduce the cost of silicon wafers, there is a market demand for thinning the silicon wafers of the photovoltaic cells. However, when the silicon wafers are thinned, due to an uneven thermal expansion of the welding strips, between the interconnected busbars and the thin silicon wafers, the resulting stress and strain are also easy to cause silicon wafer damage. Especially, the thermal expansion deformation of a copper welding strip has the greatest effect at its end. According to a research paper [Solar Energy Materials & Solar Cells 215 (2020) 110667] by the University of New South Wales, Australia, the stress at the end of the copper welding strip can accumulate to more than 150 MPa, which is very easy to cause cracking.

SUMMARY OF THE INVENTION

The technical problem to be solved by the present invention is to reduce silver consumption while ensuring reliable mechanical fixation between interconnected busbars and photovoltaic cells.

The technical scheme adopted by the present invention to solve the technical problem is as follows: a photovoltaic cell module, comprising a photovoltaic cell layer, wherein photovoltaic cells in the photovoltaic cell layer derive a current through interconnected busbars, wherein there are conductive or non-conductive connection points between the photovoltaic cells and the interconnected busbars for preliminary fixation of the interconnected busbars and the photovoltaic cells, a grid line bonding layer and a grid line supporting layer are provided on the surfaces of the photovoltaic cells for completely fixing the interconnected busbars to the surfaces of the photovoltaic cells, and the grid line supporting layer adheres to the surfaces of the photovoltaic cells by a bonding effect of the grid line bonding layer, and the grid line supporting layer is laminated on the interconnected busbars.

In this scheme of the present invention, the function of mechanically fixing the interconnected busbars is provided by the grid line supporting layer, which tightly presses the interconnected busbars on the surfaces of the photovoltaic cells, thus limiting the movement of the interconnected busbars and realizing the complete fixation of the interconnected busbars, which helps the module to resist a temperature change of an external environment. The connection points between the interconnected busbars and the photovoltaic cells only play a preliminary fixation role, which facilitates to connect the photovoltaic cells into a photovoltaic cell string for a subsequent fabrication step, so compared with the existing scheme of electrical connection of busbarless photovoltaic cells, in which the interconnected busbars are mechanically fixed by many Ag paste pads, the scheme of the present invention requires a small number of connection points, and can achieve low Ag consumption or no Ag consumption of the connection points. Compared with the second scheme of electrical connection of busbarless photovoltaic cells of Meyer Burger Company, Switzerland, the scheme of the present invention has a lower manufacturing cost, and can be implemented by relying on traditional existing equipment or simple modification.

In the scheme of the present invention, the interconnected busbars are mechanically fixed by the grid line supporting layer, the stress caused by thermal expansion is evenly distributed onto the entire interconnected busbars of about 100 mm on the surfaces of the photovoltaic cells, and the stress at the end of the interconnected busbars can be reduced by a factor of about 100. Therefore, by using the method of the present invention, the probability of silicon wafer breakage can be greatly reduced. At the same time, even if the silicon wafer is damaged due to other reasons, such as a collision in a cell manufacturing process, it will be bonded together by the grid line bonding layer and the grid line supporting layer, which will not affect the power generation. Therefore, the use of the present invention is beneficial to the thinning of silicon wafers.

The present invention is generally applicable to various high-efficiency cells, such as common heterojunction cells, passivated contact TOPCON cells, IBC back-junction cells, perovskite cells, and other thin-film and crystalline silicon stacked cells. The present invention is particularly beneficial to be implemented on heterojunction cells, and the material cost gap between the heterojunction cells and the conventional PERC cells is narrowed.

A specific scheme in which the grid line supporting layer adheres to the surface of the photovoltaic cell by a bonding effect of the grid line bonding layer is that: the grid line bonding layer is located between the grid line supporting layer and the photovoltaic cell for adhering of the grid line supporting layer to the surface of the photovoltaic cell, wherein the thickness of the grid line bonding layer is smaller than the thicknesses of the interconnected busbars.

Further, the interconnected busbars are embedded in the grid line bonding layer, or gaps exist between the interconnected busbars and the grid line bonding layer. When the interconnected busbars are embedded in the grid line bonding layer, the grid line bonding layer and the grid line supporting layer may jointly fix the interconnected busbars mechanically, and the fixing effect is relatively better.

Further, the photovoltaic cell module further comprises a packaging structure, wherein the photovoltaic cell layer is packaged in the packaging structure, the grid line bonding layer and the grid line supporting layer cover the interconnected busbars on the surfaces of the photovoltaic cells, the surfaces of the interconnected busbars have low melting-point welding layers, and electrical contacts are formed between the interconnected busbars and the photovoltaic cells by means of the low melting-point welding layers, the interconnected busbars are embedded in the grid line bonding layer, and there is a packaging bonding layer between the grid line supporting layer and a packaging structure on the same side, for bonding the grid line supporting layer and the packaging structure on the same side together.

Further, with respect to the smallest covered unit, both the grid line supporting layer and the grid line bonding layer are whole films; or, the grid line supporting layer is a whole film and the grid line bonding layer is in the form of film strips; or, the grid line supporting layer is in the form of film strips and the grid line bonding layer is a whole film; or, both the grid line bonding layer and the grid line supporting layer are in the form of film strips.

Further, the grid line bonding layer and the grid line supporting layer are in the form of composite film strips containing the grid line bonding layer and the grid line supporting layer, at least one photovoltaic cell is taken as the smallest covered unit, and the composite film strips extend along a first direction and are arranged at intervals along a second direction; or, the composite film strips extend along the second direction and are arranged at intervals along the first direction, wherein the first direction is an extension direction of the interconnected busbars, and the second direction is perpendicular to the extension direction of the interconnected busbars.

Further, the grid line supporting layer and grid line bonding layer are polymer materials. The grid line supporting layer is PET, EVA, POE, PVB, PVF, PMMA or PC, the grid line bonding layer is silica gel, POE, EVA, TPU or liquid silica gel, the photovoltaic cells are busbarless photovoltaic cells, and the interconnected busbars are multi-busbar welding strips.

Another specific scheme in which the grid line supporting layer adheres to the surface of the photovoltaic cell by a bonding effect of the grid line bonding layer is that: the grid line supporting layer is located between the grid line bonding layer and the photovoltaic cell, the grid line supporting layer shields the grid line bonding layer only in local areas, and shielded areas and non-shielded areas of the grid line bonding layer shielded by the grid line supporting layer are respectively bonded with the grid line supporting layer and the photovoltaic cell for adhering of the grid line supporting layer to the surface of the photovoltaic cell.

Further, with respect to the smallest covered unit, the grid line supporting layer and the grid line bonding layer are both whole films, and the grid line supporting layer has hollows; or, the grid line supporting layer is in the form of film strips, and the grid line bonding layer is a whole film.

In order to ensure a good electrical connection relationship between the interconnected busbars and the photovoltaic cells, further, the surfaces of the interconnected busbars have welding layers or conductive adhesive, the welding layers are low melting-point welding layers with melting temperatures lower than a lamination temperature of the module, and the interconnected busbars are in electrical contact with the photovoltaic cells via the welding layers or conductive adhesive. The present invention does not exclude that the interconnected busbars and the photovoltaic cells are electrically connected through direct contact to derive the current of the photovoltaic cells.

A method of manufacturing the above photovoltaic cell module comprises the following steps: firstly, preliminarily fixing interconnected busbars on the surfaces of photovoltaic cells via conductive or non-conductive connection points; and then covering the surfaces of the photovoltaic cells with a grid line supporting layer and a grid line bonding layer, applying pressure on the grid line supporting layer and the grid line bonding layer, and completely fixing the interconnected busbars to the surfaces of the photovoltaic cells by means of the grid line supporting layer.

Further, the method sequentially comprises a photovoltaic cell string fabrication step and a module lamination step, wherein in the photovoltaic cell string fabrication step, the interconnected busbars are preliminarily fixed to the surfaces of photovoltaic cells via conductive or non-conductive connection points, in the module lamination step, lamination pressures are applied on the grid line supporting layer and the grid line bonding layer so that the interconnected busbars are completely fixed to the surfaces of the photovoltaic cells by means of the grid line supporting layer, and in the module lamination step, the interconnected busbars are brought into electrical contact with the photovoltaic cells.

Further, the grid line bonding layer and the grid line supporting layer are used for covering in sequence in the form of films, respectively; or, the grid line bonding layer and the grid line supporting layer are used for covering in the form of composite films containing the grid line bonding layer and the grid line supporting layer; or, the grid line bonding layer and the grid line supporting layer are used for covering in the form of composite film strips containing the grid line bonding layer and the grid line supporting layer; or, the grid line supporting layer in the form of a film and the grid line bonding layer in a liquid form are used for covering in sequence.

Further, connection points between the interconnected busbars and the photovoltaic cells are formed by welding or bonding.

A method of manufacturing a photovoltaic cell module comprises: firstly, fabricating a photovoltaic cell string, so that interconnected busbars of the photovoltaic cell string are preliminarily fixed to the surfaces of photovoltaic cells via conductive or non-conductive connection points; then, covering the interconnected busbars on the surfaces of the photovoltaic cells with a grid line bonding layer and a grid line supporting layer, wherein the grid line bonding layer is located between the grid line supporting layer and the photovoltaic cells; and finally, packaging, with a module lamination process, the photovoltaic cells in a packaging structure of the photovoltaic module, and completely fixing the interconnected busbars to the surfaces of the photovoltaic cells by means of the grid line bonding layer and the grid line supporting layer. The grid line supporting layer is bonded to the surfaces of the photovoltaic cells by means of the grid line bonding layer. The thickness of the grid line bonding layer is smaller than the thicknesses of the interconnected busbars. The grid line bonding layer is heated to flow by the module lamination process, so that the interconnected busbars are embedded in the grid line bonding layer. The grid line supporting layer is laminated on the interconnected busbars. The surfaces of the interconnected busbars have low melting-point welding layers, which are melted at a lamination temperature to form electrical contacts with the surfaces of the photovoltaic cells.

Further, the grid line bonding layer and the grid line supporting layer are used for covering in sequence in the form of films, respectively; or, the grid line bonding layer and the grid line supporting layer are used for covering in the form of composite films containing the grid line bonding layer and the grid line supporting layer; or, the grid line bonding layer and the grid line supporting layer are used for covering in the form of composite film strips containing the grid line bonding layer and the grid line supporting layer; or, the grid line supporting layer in the form of a film and the grid line bonding layer in a liquid form are used for covering in sequence.

Further, the grid line bonding layer and the grid line supporting layer are used for covering, with at least one photovoltaic cell as the smallest covered unit.

Further, the grid line bonding layer and the grid line supporting layer are used for covering in the form of composite film strips containing the grid line bonding layer and the grid line supporting layer, and the composite film strips extend along a first direction or a second direction, wherein the first direction is an extension direction of the interconnected busbars, and the second direction is perpendicular to the extension direction of the interconnected busbars.

Further, the method of manufacturing a photovoltaic cell module sequentially comprises a photovoltaic cell string fabrication step, a module arrangement step and a module lamination step, wherein the grid line bonding layer and the grid line supporting layer are arranged onto the interconnected busbars on the surfaces of the photovoltaic cells in the module arrangement step.

Furthermore, the grid line bonding layer and the grid line supporting layer cover the surface of the photovoltaic cell layer in sequence by taking the photovoltaic cell layer as the smallest covered unit and in the form of films; or, the grid line bonding layer and the grid line supporting layer cover the surface of the photovoltaic cell layer by taking the photovoltaic cell layer as the smallest covered unit and in the form of composite films containing the grid line bonding layer and the grid line supporting layer; or, for the grid line bonding layer and the grid line supporting layer, the photovoltaic cell layer is taken as the smallest covered unit, and the grid line supporting layer in the form of a film and the grid line bonding layer in a liquid form cover the surface of the photovoltaic cell layer in sequence.

Further, a method of manufacturing the photovoltaic cell module sequentially comprises a photovoltaic cell string fabrication step, a module arrangement step and a module lamination step, wherein the grid line bonding layer and the grid line supporting layer adhere to the surface of the photovoltaic cell string with the photovoltaic cell string as the smallest covered unit and in the form of composite film strips containing the grid line bonding layer and the grid line supporting layer, the composite film strips extend along a first direction and are arranged at intervals along a second direction on the surface of the photovoltaic cell string, wherein the first direction is an extension direction of the interconnected busbars, and the second direction is perpendicular to the extension direction of the interconnected busbars, and arrangement is performed on the photovoltaic cell string adhered with the composite film strips in the module arrangement step.

Further, a method of manufacturing the photovoltaic cell module sequentially comprises a photovoltaic cell string fabrication step, a photovoltaic cell string arrangement step, a module arrangement step and a module lamination step, wherein in the photovoltaic cell string arrangement step, the photovoltaic cell string is arranged in a photovoltaic cell layer as a whole according to module specifications and requirements, the grid line bonding layer and the grid line supporting layer adhere to the surface of the photovoltaic cell layer with the photovoltaic cell layer as the smallest covered unit and in the form of composite film strips containing the grid line bonding layer and the grid line supporting layer, the composite film strips extend along a second direction and are arranged at intervals along a first direction on the surface of the photovoltaic cell layer, wherein the first direction is an extension direction of the interconnected busbars, and the second direction is perpendicular to the extension direction of the interconnected busbars, and module arrangement is performed on the photovoltaic cell layer adhered with the composite film strips in the module arrangement step.

Further, in the photovoltaic cell string fabrication step, connection points between the interconnected busbars and the photovoltaic cells are formed by welding or bonding.

Welding methods include, for example, electromagnetic welding, alloy thermal welding, ultrasonic welding, friction welding, resistance welding, laser welding, etc.

bonding methods include, for example, hot melt adhesive bonding, silica gel bonding, acrylic adhesive bonding, epoxy adhesive bonding, etc.

Further, the grid line bonding layer and the grid line supporting layer are used for covering in the form of composite films containing the grid line bonding layer and the grid line supporting layer, and the composite film is a three-layer composite structure including a packaging bonding layer, a grid line supporting layer and a grid line bonding layer, wherein the packaging bonding layer is used for bonding the grid line supporting layer with a packaging structure on the same side, and the packaging bonding layer and the grid line bonding layer are located on the front and back sides of the grid line supporting layer, respectively.

A photovoltaic cell module includes a photovoltaic cell layer packaged in a packaging structure. Photovoltaic cells in the photovoltaic cell layer derive a current through interconnected busbars. There are conductive or non-conductive connection points between the photovoltaic cells and the interconnected busbars for preliminary fixation of the interconnected busbars and the photovoltaic cells. The interconnected busbars on the surfaces of the photovoltaic cells are covered with the grid line bonding layer and the grid line supporting layer, so as to completely fix the interconnected busbars to the surfaces of the photovoltaic cells. The surfaces of the interconnected busbars have low melting-point welding layers, and electrical contacts are formed between the interconnected busbars and the photovoltaic cells by means of the low melting-point welding layers. The grid line supporting layer is bonded to the surfaces of the photovoltaic cells by means of the grid line bonding layer. The interconnected busbars are embedded in the grid line bonding layer. The grid line supporting layer is laminated on the interconnected busbars. There is a packaging bonding layer between the grid line supporting layer and a packaging structure on the same side for bonding the grid line supporting layer with the packaging structure on the same side.

Further, the grid line bonding layer and the grid line supporting layer are in the form of films, with at least one photovoltaic cell as the smallest covered unit.

Further, the grid line bonding layer and the grid line supporting layer are in the form of composite film strips containing the grid line bonding layer and the grid line supporting layer, with at least one photovoltaic cell as the smallest covered unit.

Furthermore, the composite film strips extend along a first direction and are arranged at intervals along a second direction or, the composite film strips extend along the second direction and are arranged at intervals along the first direction, wherein the first direction is an extension direction of the interconnected busbars, and the second direction is perpendicular to the extension direction of the interconnected busbars.

Furthermore, for the composite film strips, the photovoltaic cell layer is taken as the smallest covered unit; the photovoltaic cell layer is formed by electrically connecting at least one photovoltaic cell string; the photovoltaic cells in the photovoltaic cell string are electrically connected through the interconnected busbars; photovoltaic cells in the string extend along a first direction and are arranged at intervals along a second direction in the photovoltaic cell layer; the composite film strips extend along a first direction and are arranged at intervals along a second direction on the surface of the photovoltaic cell layer, wherein the first direction is an extension direction of the interconnected busbars, and the second direction is perpendicular to the extension direction of the interconnected busbars; the widths of the composite film strips are larger than the widths of the interconnected busbars; and each of the interconnected busbars on the surfaces of the photovoltaic cells is completely fixed by a composite film strip.

Furthermore, for the composite film strips, the photovoltaic cell layer is taken as the smallest covered unit; the photovoltaic cell layer is formed by electrically connecting at least one photovoltaic cell string; the photovoltaic cells in the photovoltaic cell string are electrically connected through the interconnected busbars; photovoltaic cells in the string extend along a first direction and are arranged at intervals along a second direction in the photovoltaic cell layer; the composite film strips extend along a second direction and are arranged at intervals along a first direction on the surface of the photovoltaic cell layer, wherein the first direction is an extension direction of the interconnected busbars, and the second direction is perpendicular to the extension direction of the interconnected busbars; each of the interconnected busbars on the surfaces of the photovoltaic cells is fixed at multiple points by a plurality of composite film strips intersecting therewith; and fixing points are intersections of the interconnected busbars and the composite film strips.

The beneficial effects of the present invention are as follows: compared with a scheme of electrical connection of busbarless photovoltaic cells, in which interconnected busbars are mechanically fixed by means of pads, the present invention can greatly reduce the Ag consumption of the connection points of the interconnected busbars; and compared with a scheme of electrical connection of photovoltaic cells in which adhesive film electrodes have no busbar, the present invention has advantages of convenient manufacture and lower cost.

BRIEF DESCRIPTION OF THE DRAWINGS

The present invention is further illustrated below in conjunction with the accompanying drawings and embodiments.

In the figures: 1. photovoltaic cell, 2. interconnected busbars, 3. composite film, 3'. composite film strip, 3-1. grid line bonding layer, 3-2. grid line supporting layer, 3-3. packaging bonding layer, 4. connection point, 5. packaging panel, 6. packaging backplane, and 7. adhesive film electrode with multi-busbar welding strip.

DETAILED DESCRIPTION OF THE PREFERRED EMBODIMENTS

In Embodiment 1, a method of manufacturing a photovoltaic cell module is provided. Firstly, fabrication of a photovoltaic cell string in a photovoltaic cell layer of the module is performed, so that interconnected busbars 2 of the photovoltaic cell string are preliminarily fixed to the surfaces of photovoltaic cells 1 via connection points 4. Then, the interconnected busbars 2 on the surfaces of the photovoltaic cells 1 of the module are covered with a grid line bonding layer 3-1 and a grid line supporting layer 3-2. The grid line bonding layer 3-1 is located between the grid line supporting layer 3-2 and the photovoltaic cell layer. Finally, with a module lamination process, the photovoltaic cells 1 are packaged in a packaging structure of the photovoltaic module, and the interconnected busbars 2 are completely fixed to the surfaces of the photovoltaic cells 1 by means of the grid line bonding layer 3-1 and the grid line supporting layer 3-2.

Specifically, the thickness of the grid line bonding layer 3-1 is smaller than the thicknesses of the interconnected busbars 2. The grid line bonding layer 3-1 is heated to flow by the module lamination process, so that the interconnected busbars 2 are embedded in the grid line bonding layer 3-1. The grid line supporting layer 3-2 is bonded to the surfaces of the photovoltaic cells 1 by means of the grid line bonding layer 3-1, and the grid line supporting layer 3-2 is laminated on the interconnected busbars 2, so that the interconnected busbars 2 are completely fixed to the surfaces of the photovoltaic cells by means of the grid line bonding layer 3-1 and the grid line supporting layer 3-2. The surfaces of the interconnected busbars 2 have low melting-point welding layers, which are melted at a lamination temperature to form electrical contacts with the surfaces of the photovoltaic cells 1.

Figure 3:
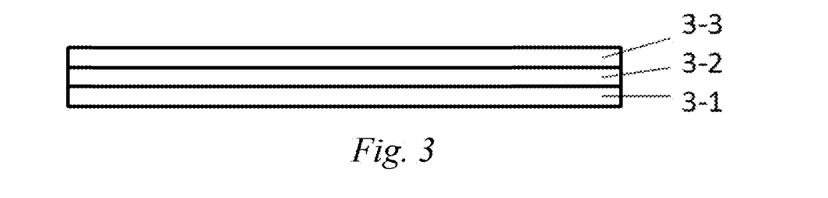
FIG. 3 is a schematic diagram showing the structure of a composite film according to Embodiment 1 of the present invention.

The grid line bonding layer 3-1 and the grid line supporting layer 3-2 are used for covering in the form of composite films 3 containing the grid line bonding layer 3-1 and the grid line supporting layer 3-2. As shown in FIG. 3, the composite film 3 is a three-layer composite structure, including a packaging bonding layer 3-3, a grid line supporting layer 3-2 and a grid line bonding layer 3-1. The packaging bonding layer 3-3 is used for bonding the grid line supporting layer 3-2 with a packaging structure on the same side. The packaging bonding layer 3-3 and the grid line bonding layer 3-1 are located on the front and back sides of the grid line supporting layer 3-2, respectively.

The packaging bonding layer 3-3, the grid line supporting layer 3-2 and the grid line bonding layer 3-1 are composed of three layers of different materials or the same material. Through different treatments, different degrees of polymerization and/or cross-linking occur between the three layers, resulting in a three-layer composite structure.

Figure 2:
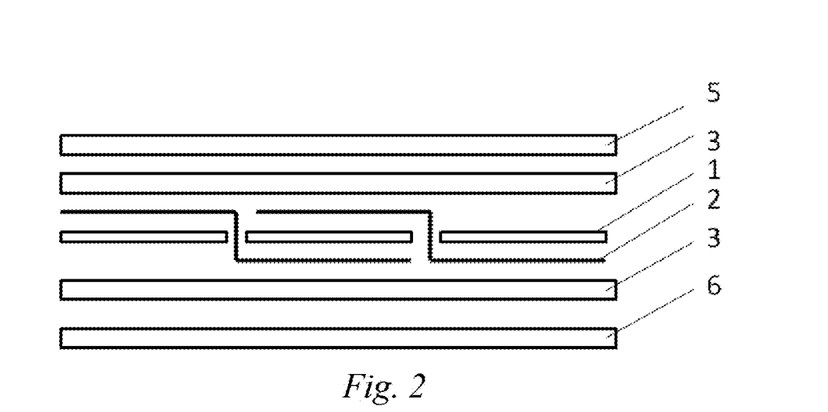
FIG. 2 is a schematic diagram showing the structure of a photovoltaic cell module according to Embodiment 1 of the present invention.
Figure 4:
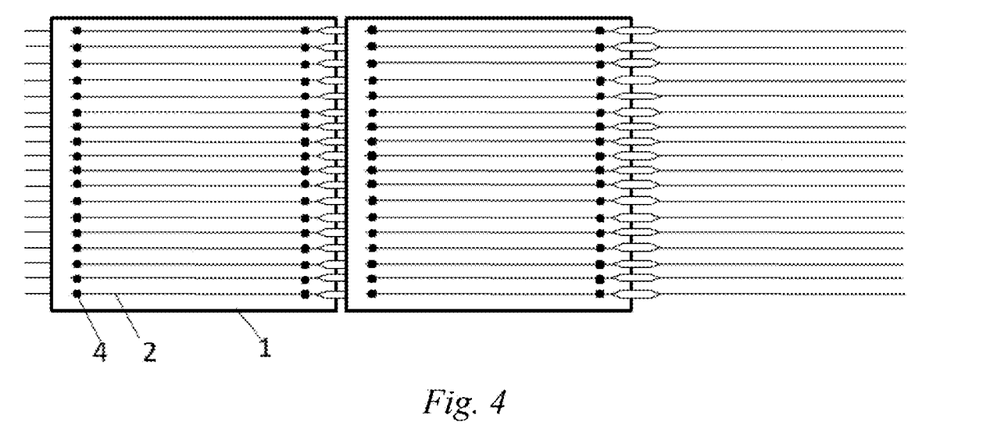
FIG. 4 is a schematic structural diagram showing a preliminary connection between interconnected busbars and busbarless photovoltaic cells via connection points according to Embodiment 1 of the present invention.

As shown in FIGS. 2, 3 and 4, the photovoltaic cell module manufactured by the method of manufacturing a photovoltaic cell module in Embodiment 1 includes the photovoltaic cell layer packaged in the packaging structure. The photovoltaic cells 1 in the photovoltaic cell layer derive a current through the interconnected busbars 2. There are conductive connection points 4 between the photovoltaic cells 1 and the interconnected busbars 2 for preliminary fixation of the interconnected busbars 2 and the photovoltaic cells 1. The interconnected busbars on the surfaces of the photovoltaic cells are covered with the grid line bonding layer 3-1 and the grid line supporting layer 3-2, so as to completely fix the interconnected busbars 2 to the surfaces of the photovoltaic cells 1. The surfaces of the interconnected busbars 2 have low melting-point welding layers, and electrical contacts are formed between the interconnected busbars 2 and the photovoltaic cells 1 by means of the low melting-point welding layers. The grid line supporting layer 3-2 is bonded to the surfaces of the photovoltaic cells 1 by means of the grid line bonding layer 3-1. The interconnected busbars 2 are embedded in the grid line bonding layer 3-1. The grid line supporting layer 3-2 is laminated on the interconnected busbars 2. There is a packaging bonding layer 3-3 between the grid line supporting layer 3-2 and a packaging structure on the same side for bonding the grid line supporting layer 3-2 with the packaging structure on the same side.

The photovoltaic cell layer is formed by electrically connecting at least one photovoltaic cell string. The photovoltaic cells 1 in the photovoltaic cell string are electrically connected through the interconnected busbars 2. Photovoltaic cells in the string extend along a first direction and are arranged at intervals along a second direction in the photovoltaic cell layer.

The composite film 3 covers the entire surface of the photovoltaic cell layer with the entire photovoltaic cell layer as the smallest covered unit.

The grid line supporting layer 3-2 is a polymer material that is not easy to flow at a lamination temperature, such as PET, PVF, PMMA or PC, and its thickness is about 5 um to 50 um. The grid line supporting layer 3-2 may be subjected to a surface treatment to enhance the bonding between film layers. The grid line bonding layer 3-1 is a polymer adhesive material that is easy to flow at a lamination temperature, such as silica gel, POE, EVA, TPU or other hot adhesives, and its thickness is 20 um to 150 um. The packaging bonding layer 3-3 is a polymer adhesive material that is easy to flow at a lamination temperature, such as EVA, POE, PVB, TPO or other common film layers, and its thickness is about 200 um to 600 um. The photovoltaic cells 1 are busbarless photovoltaic cells, and the interconnected busbars 2 are multi-busbar welding strips.

Figure 1:
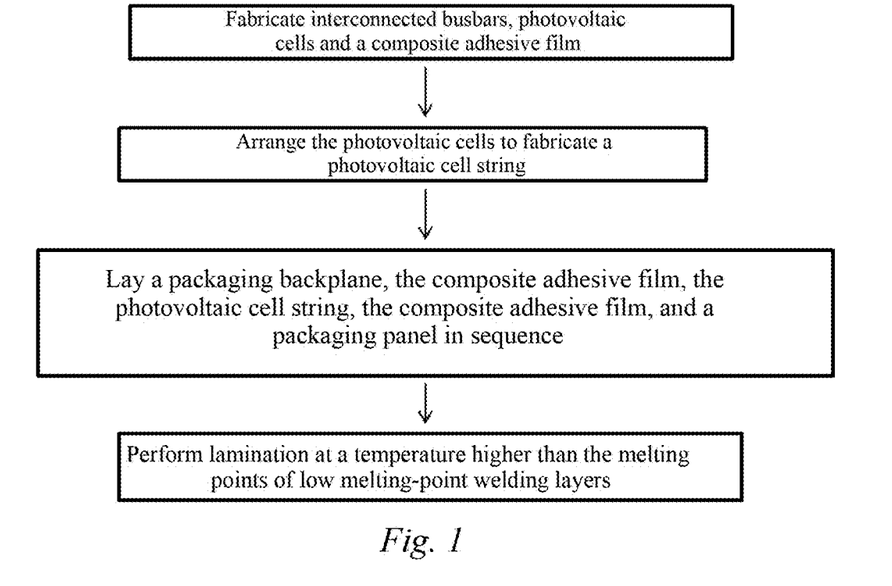
FIG. 1 is a flow chart of manufacturing a photovoltaic cell module according to Embodiment 1 of the present invention.

As shown in FIG. 1, the specific steps of the method of manufacturing a photovoltaic cell module in Embodiment 1 are as follows:

(a) The interconnected busbars 2, the photovoltaic cells 1 and the composite film 3 are fabricated in advance. The interconnected busbars 2 are multi-busbar welding strips with high purities, low expansion coefficients and low melting-point welding layers with oxygen-free copper as metal cores. The low melting-point welding layer is a tin layer doped with Bi, Ag and other elements to reduce the melting point, such as Sn42Bi57Ag1. The photovoltaic cells 1 are busbarless photovoltaic cells, and there are multiple pads on the busbarless photovoltaic cells for connecting the multi-busbar welding strips to the busbarless photovoltaic cells.

(b) Photovoltaic cell string fabrication:

The photovoltaic cells 1 are placed on a welding table and are arranged. The pads are subjected to a local energy treatment, such as local infrared radiation heating or local electromagnetic induction heating, so as to weld the interconnected busbars 2 on the pads, forming multiple connection points 4, so that the interconnected busbars 2 are preliminarily fixed to the photovoltaic cells 1, and the photovoltaic cells 1 are connected in series by means of the interconnected busbars 2 to form a photovoltaic cell string.

Figure 6:
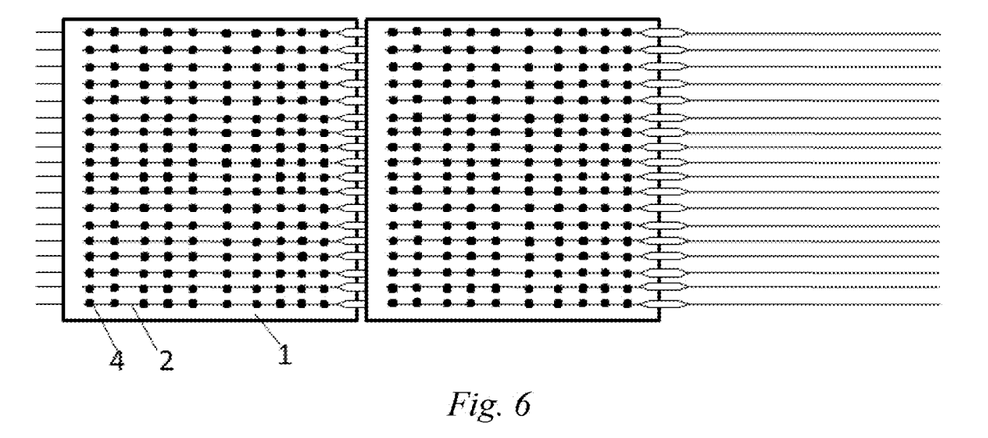
FIG. 6 is a schematic structural diagram showing that interconnected busbars are fixed to photovoltaic cells via cell busbar pads in the prior art.

As shown in FIG. 6, in an existing electrical connection technology for busbarless photovoltaic cells, a photovoltaic cell 1 with 18 interconnected busbars 2 on its surface usually needs 180 connection points 4 to meet the technical requirement for reliable mechanical fixation between the interconnected busbars 2 and the photovoltaic cell 1.

Figure 5:
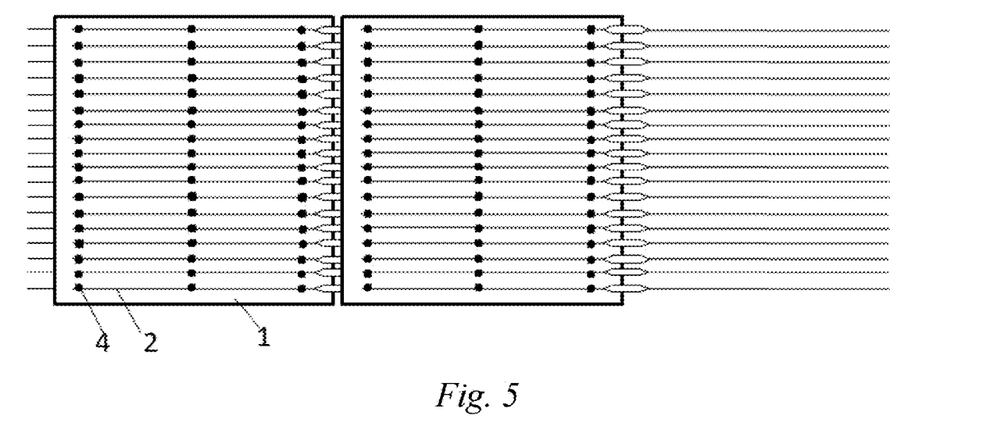
FIG. 5 is another schematic structural diagram showing a preliminary connection between interconnected busbars and busbarless photovoltaic cells via connection points according to Embodiment 1 of the present invention.

However, in the present invention, as shown in FIG. 4, a photovoltaic cell 1 is connected to the interconnected busbars 2 via 36 connection points 4, so as to fabricate a photovoltaic cell string required in Embodiment 1. In FIG. 5, a photovoltaic cell 1 is connected to the interconnected busbars 2 via 54 connection points 4, so as to fabricate a photovoltaic cell string required in Embodiment 1. The number of the required connection points 4 is much smaller than the number of connection points 4 required in the existing electrical connection technology for busbarless photovoltaic cells in which the interconnected busbars 2 are welded by pads, so the consumption of Ag paste on the pads can be saved.

(c) Module arrangement:

The packaging backplane 6, the composite film 3, the photovoltaic cell string, the composite film 3, and the packaging panel 5 are laid in sequence to obtain a laminate for module lamination. The packaging backplane 6 and the packaging panel 5 are packaging structures of the module.

Since the composite film 3 in Embodiment 1 is a three-layer composite structure of the packaging bonding layer 3-3, the grid line supporting layer 3-2 and the grid line bonding layer 3-1, the arrangement step for the packaging bonding layer 3-3 may be omitted, thus simplifying the production process.

(d) Module lamination:

The lamination is performed at a lamination temperature higher than the melting points of the low melting-point welding layers of the interconnected busbars 2. During lamination, the low melting-point welding layers of the interconnected busbars 2 are melted to form a good conductive relationship with Ag finger lines on the surfaces of the photovoltaic cells 1. If the photovoltaic cells 1 are heterojunction cells, during lamination, the low melting-point welding layers are melted, which not only form a good conductive relationship with the Ag finger lines on the surfaces of the photovoltaic cells 1, but also adhere to the 2 um to 7 um textured surfaces of the photovoltaic cells 1 to form a good physical contact and a certain conductive contact.

During lamination, the grid line bonding layer 3-1 is heated to flow, so that the interconnected busbars 2 are embedded in the grid line bonding layer 3-1. The grid line supporting layer 3-2 is laminated on the interconnected busbars 2. After lamination and cooling, the grid line bonding layer 3-1 and the grid line supporting layer 3-2 press the interconnected busbars 2 tightly on the surfaces of the photovoltaic cells 1, thus restricting the movement of the interconnected busbars 2 and realizing the complete fixation of the interconnected busbars 2, which helps the module to resist a temperature change of an external environment.

Figure 7:
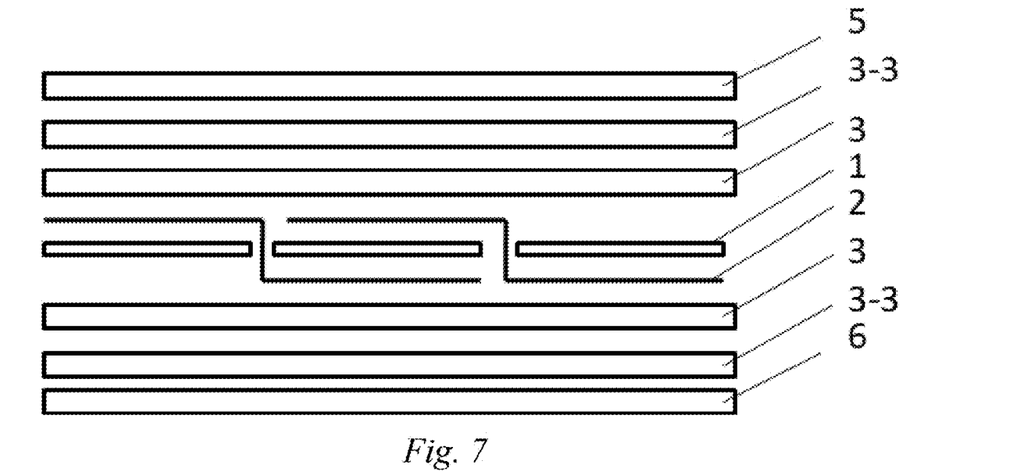
FIG. 7 is a schematic diagram showing the structure of a photovoltaic cell module according to Embodiment 2 of the present invention.
Figure 8:
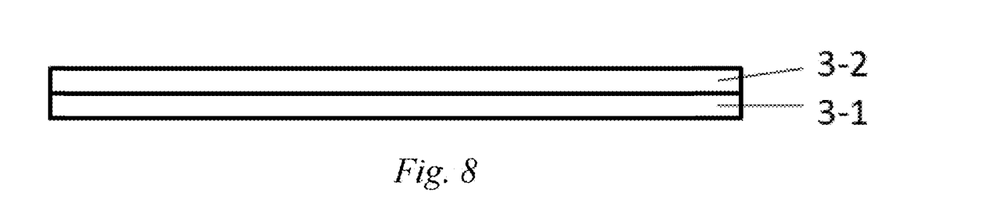
FIG. 8 is a schematic diagram showing the structure of a composite film according to Embodiment 2 of the present invention.

In Embodiment 2, a method of manufacturing a photovoltaic cell module is provided, which is basically the same as that in Embodiment 1, and the difference lies in that: the composite film 3 is a two-layer composite structure of the grid line supporting layer 3-2 and the grid line bonding layer 3-1, as shown in FIGS. 7 and 8.

Steps (a), (b) and (d) of the specific steps in Embodiment 2 are the same as those in Embodiment 1, and the difference lies in step (c).

In step (c), the packaging backplane 6, the packaging bonding layer 3-3, the composite film 3, the photovoltaic cell string, the composite film 3, the packaging bonding layer 3-3, and the packaging panel 5 are laid in sequence.

Embodiment 3 is basically the same as Embodiment 1, and the difference lies in that: the interconnected busbars 2 of the photovoltaic cell string are preliminarily fixed to the surfaces of the photovoltaic cells 1 via non-conductive connection points 4. The non-conductive connection points 4 are usually formed by bonding with adhesives, such as hot melt adhesive, silica gel, acrylic adhesive, epoxy adhesive, and the like. Part of the adhesive needs to be cured by local UV light irradiation to produce a bonding effect.

Compared with the existing electrical connection technology for busbarless photovoltaic cells shown in FIG. 6, the consumption of Ag paste on the pads is zero in Embodiment 3.

Figure 9:
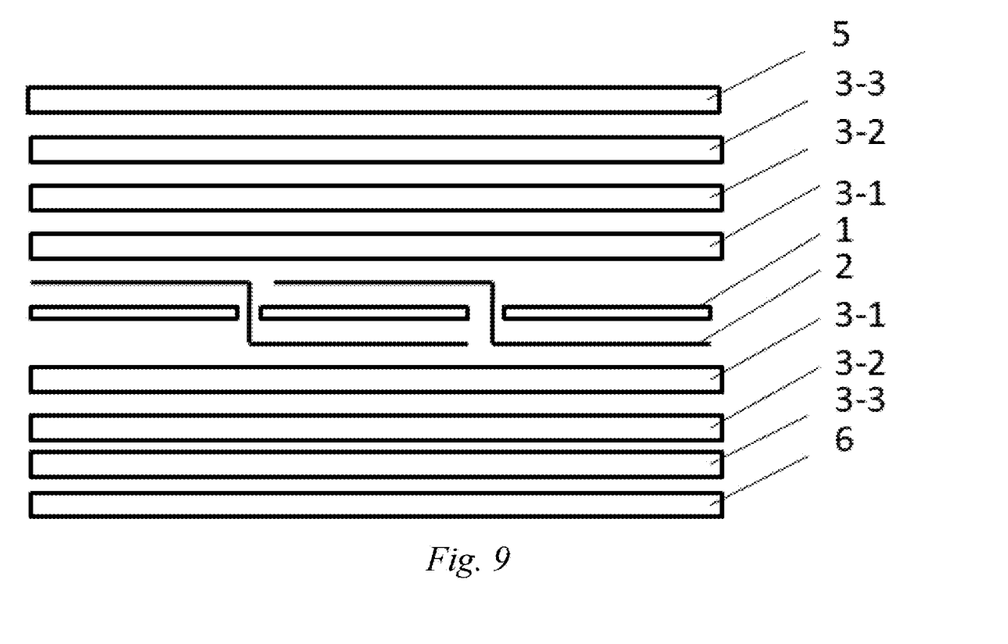
FIG. 9 is a schematic diagram showing the structure of a photovoltaic cell module according to Embodiment 4 of the present invention.

In Embodiment 4, as shown in FIG. 9, a method of manufacturing a photovoltaic cell module is provided, which is basically the same as that in Embodiment 1, and the difference lies in that: the grid line bonding layer 3-1 and the grid line supporting layer 3-2 cover the entire surface of the photovoltaic cell layer in sequence in the form of films with the entire photovoltaic cell layer as the smallest covered unit.

Steps (b) and (d) of the specific steps in Embodiment 4 are the same as those in Embodiment 1, and the difference lies in steps (a) and (c).

In step (a), a compounding and fabrication process of the grid line bonding layer 3-1 and the grid line supporting layer 3-2 is omitted.

In step (c), the packaging backplane 6, the packaging bonding layer 3-3, the grid line supporting layer 3-2, the grid line bonding layer 3-1, the photovoltaic cell string, the grid line bonding layer 3-1, the grid line supporting layer 3-2, the packaging bonding layer 3-3, and the packaging panel 5 are laid in sequence.

In Embodiment 5, a method of manufacturing a photovoltaic cell module is provided, which is basically the same as that in Embodiment 1, and the difference lies in that: the grid line bonding layer 3-1 and the grid line supporting layer 3-2 adhere to the surface of the photovoltaic cell string in the form of composite film strips 3' containing the grid line bonding layer 3-1 and the grid line supporting layer 3-2. The composite film strip 3' is a two-layer composite structure of the grid line supporting layer 3-2 and the grid line bonding layer 3-1, as shown in FIG. 8. For the composite film strip 3', a photovoltaic cell string is taken as the smallest covered unit. The composite film strips 3' extend along a first direction and are arranged at intervals along a second direction on the surface of the photovoltaic cell string. The first direction is an extension direction of the interconnected busbars 2. The second direction is perpendicular to the extension direction of the interconnected busbars 2.

The specific steps of the method of manufacturing a photovoltaic cell module in Embodiment 5 are the following steps (a) to (d).

In step (a), the interconnected busbars 2, the photovoltaic cells 1 and the composite film strips 3' are fabricated in advance. The photovoltaic cells 1 are busbarless photovoltaic cells, and the busbarless photovoltaic cell has a plurality of pads.

(b) Photovoltaic cell string fabrication:

The photovoltaic cells 1 are placed on a welding table and are arranged. The interconnected busbars 2 are welded on the pads, forming multiple connection points 4, so that the interconnected busbars 2 are preliminarily fixed to the photovoltaic cells 1, and the photovoltaic cells 1 are connected in series by means of the interconnected busbars 2 to form a photovoltaic cell string.

Figure 10:
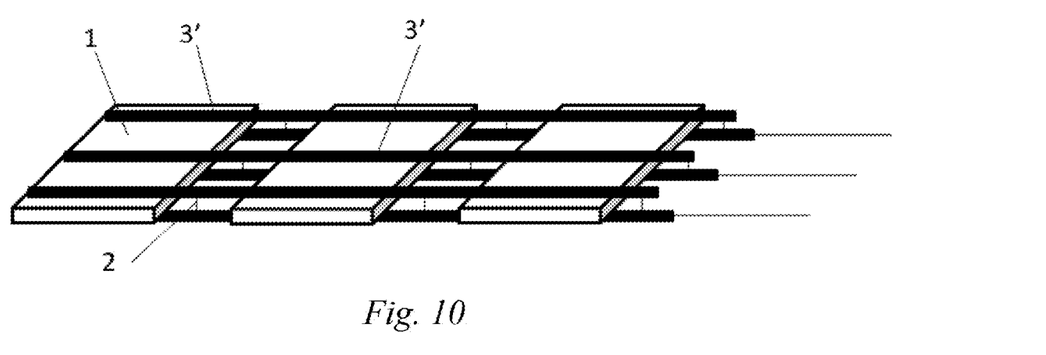
FIG. 10 is a three-dimensional schematic structural diagram showing that interconnected busbars are fixed by means of composite film strips according to Embodiment 5 of the present invention.
Figure 11:
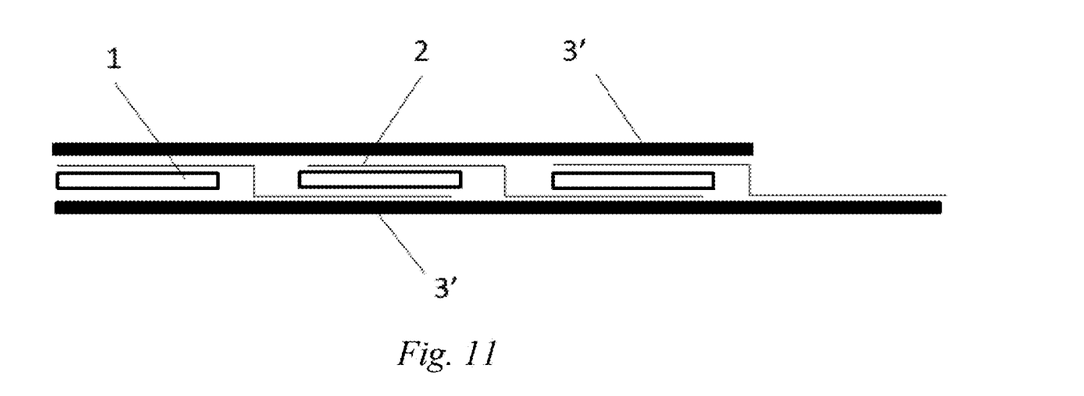
FIG. 11 is a side-view schematic structural diagram showing that interconnected busbars are fixed by composite film strips according to Embodiment 5 of the present invention.

As shown in FIGS. 10 and 11, the composite film strips 3' adhere to the surface of the photovoltaic cell string in a way that they extend along the first direction and are arranged at intervals along the second direction on the surface of the photovoltaic cell string. Arrangement is performed on the photovoltaic cell string adhered with the composite film strips 3' in a module arrangement step. The composite film strips 3' adhere to the surface of the photovoltaic cell string by slightly heating the grid line bonding layer 3-1.

(c) Module arrangement:

The packaging backplane 6, the packaging bonding layer 3-3, the photovoltaic cell string adhered with the composite film strips 3', the packaging bonding layer 3-3, and the packaging panel 5 are laid in sequence to obtain a laminate for module lamination.

(d) Module lamination:

The lamination is performed at a lamination temperature higher than the melting points of the low melting-point welding layers of the interconnected busbars 2. During lamination, the low melting-point welding layers of the interconnected busbars 2 are melted to form a good conductive relationship with Ag finger lines on the surfaces of the photovoltaic cells 1.

During lamination, the grid line bonding layer 3-1 is heated to flow, so that the interconnected busbars 2 are embedded in the grid line bonding layer 3-1. The grid line supporting layer 3-2 is laminated on the interconnected busbars 2. After lamination and cooling, the grid line bonding layer 3-1 and grid line supporting layer 3-2 press the interconnected busbars 2 tightly on the surfaces of the photovoltaic cells 1, thus restricting the movement of the interconnected busbars 2.

The photovoltaic cell module manufactured by the method of manufacturing a photovoltaic cell module in Embodiment 5 includes the photovoltaic cell layer packaged in the packaging structure. The photovoltaic cells 1 in the photovoltaic cell layer derive a current through the interconnected busbars 2. There are conductive connection points 4 between the photovoltaic cells 1 and the interconnected busbars 2 for preliminary fixation of the interconnected busbars 2 and the photovoltaic cells 1. The interconnected busbars 2 on the surfaces of the photovoltaic cells 1 are covered with the grid line bonding layer 3-1 and the grid line supporting layer 3-2, so as to completely fix the interconnected busbars 2 to the surfaces of the photovoltaic cells 1. The surfaces of the interconnected busbars 2 have low melting-point welding layers, and electrical contacts are formed between the interconnected busbars 2 and the photovoltaic cells 1 by means of the low melting-point welding layers. The grid line supporting layer 3-2 is bonded to the surfaces of the photovoltaic cells 1 by means of the grid line bonding layer 3-1. The interconnected busbars 2 are embedded in the grid line bonding layer 3-1. The grid line supporting layer 3-2 is laminated on the interconnected busbars 2. There is a packaging bonding layer 3-3 between the grid line supporting layer 3-2 and a packaging structure on the same side for bonding the grid line supporting layer 3-2 with the packaging structure on the same side.

The photovoltaic cell layer is formed by electrically connecting at least one photovoltaic cell string. The photovoltaic cells 1 in the photovoltaic cell string are electrically connected through the interconnected busbars 2. Photovoltaic cells in the string extend along a first direction and are arranged at intervals along a second direction in the photovoltaic cell layer.

The grid line bonding layer 3-1 and the grid line supporting layer 3-2 are covered at intervals on the surface of the photovoltaic cell layer in the form of composite film strips 3' containing the grid line bonding layer 3-1 and the grid line supporting layer 3-2.

Because photovoltaic cells in the string extend along a first direction and are arranged at intervals along a second direction in the photovoltaic cell layer, for the composite film strip 3', a photovoltaic cell string can be regarded as the smallest covered unit or the photovoltaic cell layer can be regarded as the smallest covered unit. The composite film strips 3' extend along the first direction and are arranged at intervals along the second direction on the surface of the photovoltaic cell layer. The widths of the composite film strips 3' are larger than the widths of the interconnected busbars 2. Each of the interconnected busbars 2 on the surfaces of the photovoltaic cells 1 is integrally fixed by a composite film strip 3'. In FIG. 10, each of the interconnected busbars 2 corresponds to a composite film strip 3', but it is not excluded that a plurality of interconnected busbars 2 correspond to a composite film strip 3'.

In Embodiment 5, if the widths of the interconnected busbars 2 are 0.27 mm, and the spacing between the interconnected busbars 2 is 8.75 mm, the widths of the composite film strips 3' only need to be about 4 mm, and the spacing between the composite film strips 3' is about 4.75 mm. The amount of the composite film strips 3' is about 45% of the area of the photovoltaic cell layer.

In the prior art in which the photovoltaic cells are connected in series by means of the adhesive film electrodes 7 with multi-busbar welding strips as shown in FIG. 12, the amount of adhesive film is more than 90% of the area of the photovoltaic cell layer, which has a high cost and a shading influence.

Compared with the prior art, the technical scheme in Embodiment 5 can reduce the amount of the composite adhesive strips 3', which has a cost-effective advantage, a reduced shading influence and an increased power.

Figure 13:
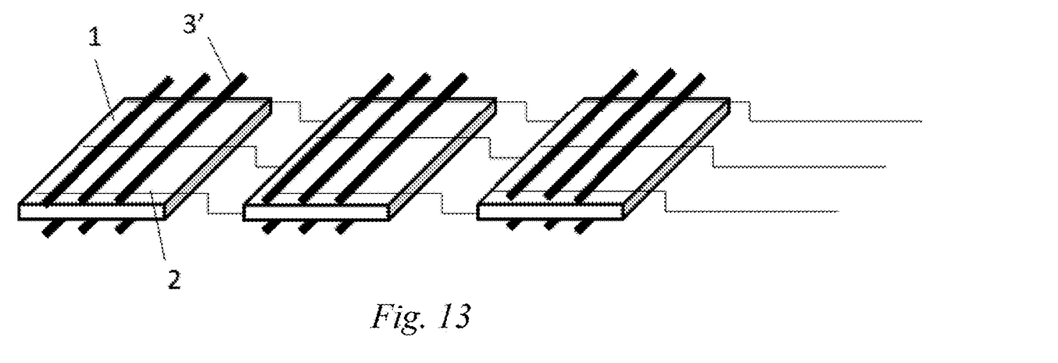
FIG. 13 is a three-dimensional schematic structural diagram showing that interconnected busbars are fixed by means of composite film strips according to Embodiment 6 of the present invention.

In Embodiment 6, a method of manufacturing a photovoltaic cell module is provided, which is basically the same as that in Embodiment 5, and the difference lies in that: the method sequentially includes a photovoltaic cell string fabrication step, a photovoltaic cell string arrangement step, a module arrangement step and a module lamination step, where in the photovoltaic cell string arrangement step, the photovoltaic cell string is arranged in a photovoltaic cell layer as a whole according to module specifications and requirements, the composite film strips 3' adhere to the surface of the photovoltaic cell layer with the photovoltaic cell layer as the smallest covered unit, the composite film strips 3' extend along a second direction and are arranged at intervals along a first direction on the surface of the photovoltaic cell layer, and module arrangement is performed on the photovoltaic cell layer adhered with the composite film strips 3' in the module arrangement step. The composite film strips 3' are used for attaching by slightly heating the grid line bonding layer 3-1.

The specific steps of the method of manufacturing a photovoltaic cell module in Embodiment 6 are the following steps (a) to (d).

In step (a), the interconnected busbars 2, the photovoltaic cells 1 and the composite film strips 3' are fabricated in advance. The photovoltaic cells 1 are busbarless photovoltaic cells, and the busbarless photovoltaic cell has a plurality of pads.

(b) Photovoltaic cell string fabrication:

The photovoltaic cells 1 are placed on a welding table and are arranged. The interconnected busbars 2 are welded on the pads, forming multiple connection points 4, so that the interconnected busbars 2 are preliminarily fixed to the photovoltaic cells 1, and the photovoltaic cells 1 are connected in series by means of the interconnected busbars 2 to form a photovoltaic cell string.

(c) Photovoltaic cell string arrangement:

The photovoltaic cell string is arranged in a photovoltaic cell layer as a whole according to module specifications and requirements, the composite film strips 3' adhere to the surface of the photovoltaic cell layer with the photovoltaic cell layer as the smallest covered unit, the composite film strips 3' extend along a second direction and are arranged at intervals along a first direction on the surface of the photovoltaic cell layer, and module arrangement is performed on the photovoltaic cell layer adhered with the composite film strips 3' in the module arrangement step.

(d) Module arrangement:

The packaging backplane 6, the packaging bonding layer 3-3, the photovoltaic cell layer adhered with the composite film strips 3', the packaging bonding layer 3-3, and the packaging panel 5 are laid in sequence to obtain a laminate for module lamination.

(e) Module Lamination:

The lamination is performed at a lamination temperature higher than the melting points of the low melting-point welding layers of the interconnected busbars 2. During lamination, the low melting-point welding layers of the interconnected busbars 2 are melted to form a good conductive relationship with Ag finger lines on the surfaces of the photovoltaic cells 1.

Figure 14:
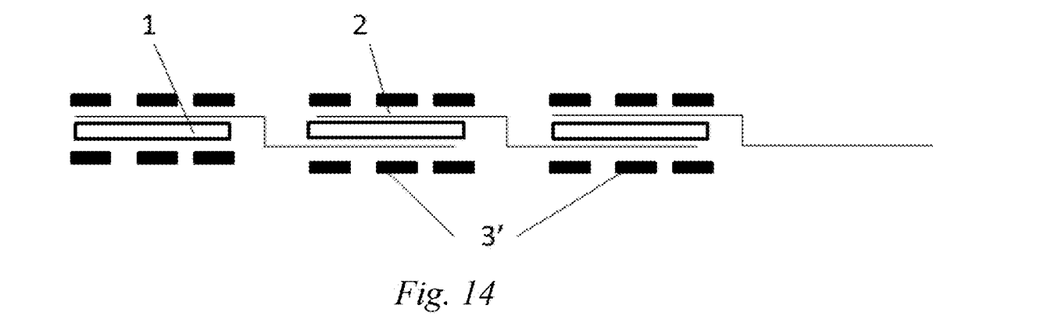
FIG. 14 is a side-view schematic structural diagram showing that interconnected busbars are fixed by composite film strips according to Embodiment 6 of the present invention.

During lamination, the grid line bonding layer 3-1 is heated to flow, so that the interconnected busbars 2 are embedded in the grid line bonding layer 3-1. The grid line supporting layer 3-2 is laminated on the interconnected busbars 2. After lamination and cooling, the grid line bonding layer 3-1 and grid line supporting layer 3-2 press the interconnected busbars 2 tightly on the surfaces of the photovoltaic cells 1, thus restricting the movement of the interconnected busbars 2.

As shown in FIGS. 13 and 14, the photovoltaic cell module manufactured by the method of manufacturing a photovoltaic cell module in Embodiment 6 is basically the same as that in Embodiment 5, and the difference lies in that: the composite film strips 3' extend along a second direction and are arranged at intervals along a first direction on the surface of the photovoltaic cell layer, each of the interconnected busbars 2 on the surfaces of the photovoltaic cells 1 is fixed at multiple points by a plurality of composite film strips 3' intersecting therewith, and fixing points are intersections of the interconnected busbars 2 and the composite film strips 3'.

In Embodiment 6, if the widths of the interconnected busbars 2 are 0.27 mm, and the spacing between the interconnected busbars 2 is 8.75 mm, the widths of the composite film strips 3' only need to be about 4 mm, and the spacing between the composite film strips 3' is about 8 mm. The amount of the composite film strips 3' is about 30% of the area of the photovoltaic cell layer. Compared with Embodiment 5, it has advantages in cost and shading.

Figure 15:
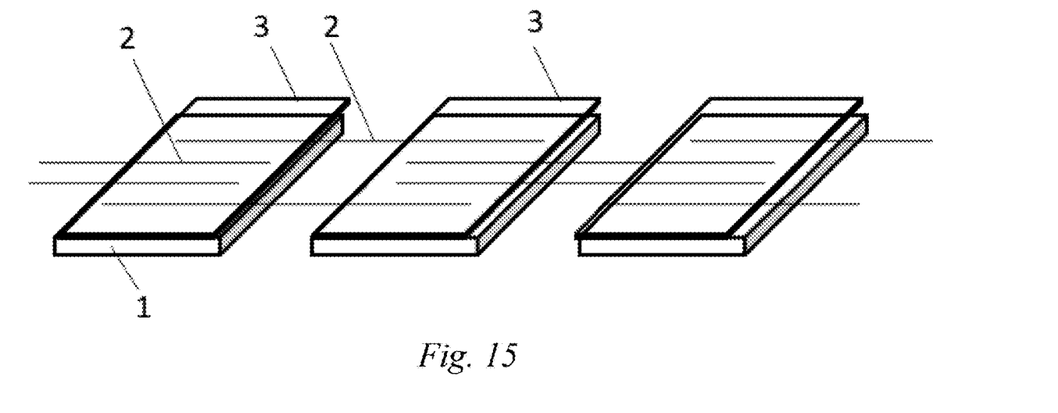
FIG. 15 is a three-dimensional schematic structural diagram showing that interconnected busbars are fixed by means of composite films according to Embodiment 7 of the present invention.
Figure 16:
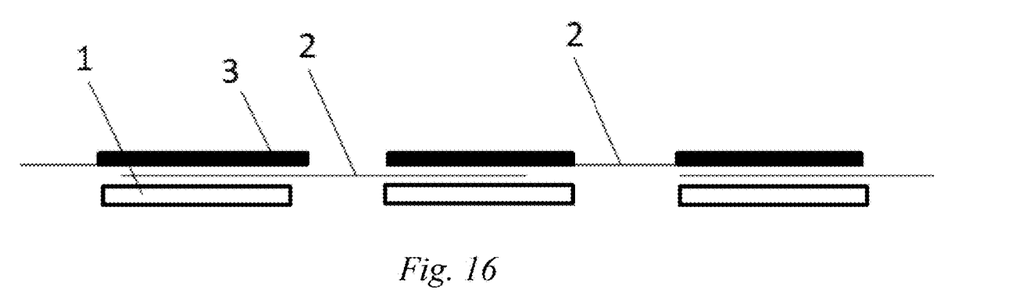
FIG. 16 is a side-view schematic structural diagram showing that interconnected busbars are fixed by means of composite films according to Embodiment 7 of the present invention.

Embodiment 7 is basically the same as Embodiment 2, and the difference lies in that: the photovoltaic cells 1 are busbarless IBC back-junction cells, the interconnected busbars 2 are all located on one side of the photovoltaic cell string, and the composite films 3 are used for covering, with a single photovoltaic cell as the smallest covered unit, as shown in FIGS. 15 and 16.

Embodiment 8 is basically the same as Embodiment 7, and the difference lies in that: the composite film 3 covers the entire surface of the photovoltaic cell layer with the entire photovoltaic cell layer as the smallest covered unit.

Embodiment 9 is basically the same as Embodiment 4, and the difference lies in that: the grid line supporting layer in the form of a film and the grid line bonding layer in a liquid form are used for covering in sequence.

The packaging bonding layer 3-3 and the grid line bonding layer 3-1 are liquid silica gel, and the grid line supporting layer 3-2 is PET, PVF, PMMA or PC.

The specific steps of the method of manufacturing a photovoltaic cell module in Embodiment 9 are the following steps (a) to (d).

In step (a), the interconnected busbars 2 and the photovoltaic cells 1 are fabricated in advance. The photovoltaic cells 1 are busbarless photovoltaic cells, and the busbarless photovoltaic cell has a plurality of pads.

(b) Photovoltaic cell string fabrication:

The photovoltaic cells 1 are placed on a welding table and are arranged. The interconnected busbars 2 are welded on the pads, forming multiple connection points 4, so that the interconnected busbars 2 are preliminarily fixed to the photovoltaic cells 1, and the photovoltaic cells 1 are connected in series by means of the interconnected busbars 2 to form a photovoltaic cell string.

(c) Module arrangement:

A laminate for module lamination is obtained by laying the packaging backplane 6, coating with the liquid silica gel, laying the grid line supporting layer 3-2, coating with the liquid silica gel, laying the photovoltaic cell string, coating with the liquid silica gel, laying the grid line supporting layer 3-2, coating with the liquid silica gel, and laying the packaging panels 5 in sequence.

The coating method of the liquid silica gel is as follows: the photovoltaic cell layer is taken as the smallest covered unit, and A/B components of the liquid silica gel are mixed for coating.

(d) Module lamination:

The lamination is performed at a lamination temperature higher than the melting points of the low melting-point welding layers of the interconnected busbars 2. During lamination, the low melting-point welding layers of the interconnected busbars 2 are melted to form a good conductive relationship with Ag finger lines on the surfaces of the photovoltaic cells 1.

During lamination, the grid line supporting layer 3-2 is laminated on the interconnected busbars 2, and the grid line bonding layer 3-1 is heated into a solid form. After lamination and cooling, the grid line bonding layer 3-1 and the grid line supporting layer 3-2 press the interconnected busbars 2 tightly on the surfaces of the photovoltaic cells 1, thus restricting the movement of the interconnected busbars 2.

Embodiment 10 is basically the same as Embodiment 1, and the difference lies in that: the surfaces of the interconnected busbars 2 of the photovoltaic cells 1 have low melting-point welding layers, which are melted at a lamination temperature to form good electrical contacts with the interconnected busbars 2.

Specifically, the interconnected busbars 2 are metal welding strips with Sn coated layers, and the melting point of the Sn coated layer is about 230° C. The surfaces of the photovoltaic cells 1 are electroplated with Cu finger lines. Then the surfaces of the Cu finger lines are electroplated with SnBi alloy, the melting point of which is lower than 150° C. During lamination, the temperature of the module is raised to above 150° C., and the SnBi alloy on the surfaces of the Cu finger lines are melted to form a good electrical connection with the interconnected busbars 2.

Embodiment 11 is basically the same as Embodiment 1, and the difference lies in that: the surfaces of the interconnected busbars 2 have conductive adhesive, which is deformed under a lamination pressure to form good electrical contacts with the photovoltaic cells 1.

Specifically, the interconnected busbars 2 are metal welding strips with conductive adhesive (ECA) coated layers, and the conductive adhesive (ECA) may be deformed under a lamination pressure to form a good electrical connection with metal finger lines on the surfaces of the photovoltaic cells 1. The metal welding strip is Cu welding strip, and the metal finger line is Cu or Ag finger line.

Embodiment 12 is basically the same as Embodiment 1, and the difference lies in that: the grid line supporting layer 3-2 may also use cross-linked EVA, POE, PVB and other materials. The cross-linked EVA, POE, PVB and other materials are first cross-linked when used as the grid line supporting layer 3-2, and the cross-linking rate is preferably between 80% and 100%. For example, the grid line supporting layer 3-2 and the grid line bonding layer 3-1 are both made of EVA materials, because the light transmittance of an EVA film is much better than that of a PET film, so there is no need to limit the thickness of the EVA film which is used as the grid line supporting layer 3-2. Generally, the grid line supporting layer 3-2 may be made by using 300 um cross-linked EVA film after being completely cross-linked by radiation or heating, while the grid line bonding layer 3-1 may be made of conventional EVA adhesive film with a thickness of 50 um.

Figure 17:
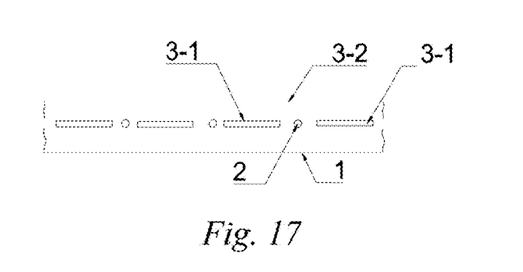
FIG. 17 is schematic diagram of a first stacked structure, which is not laminated, for fixing interconnected busbars according to Embodiment 13 of the present invention.

In Embodiment 13, a photovoltaic cell module includes a packaging structure and a photovoltaic cell layer packaged in the packaging structure. The photovoltaic cells 1 in the photovoltaic cell layer derive a current through the interconnected busbars 2. There are conductive or non-conductive connection points 4 between the photovoltaic cells 1 and the interconnected busbars 2 for preliminary fixation of the interconnected busbars 2 and the photovoltaic cells 1. The grid line bonding layer 3-1 and the grid line supporting layer 3-2 are provided on the surfaces of the photovoltaic cells 1 for completely fixing the interconnected busbars 2 to the surfaces of the photovoltaic cells 1. The grid line supporting layer 3-2 adheres to the surfaces of the photovoltaic cells 1 by a bonding effect of the grid line bonding layer 3-1. The grid line supporting layer 3-2 is laminated on the interconnected busbars 2. The grid line bonding layer 3-1 is located between the grid line supporting layer 3-2 and the photovoltaic cell 1 for adhering of the grid line supporting layer 3-2 to the surface of the photovoltaic cell 1. The thickness of the grid line bonding layer 3-1 is smaller than the thicknesses of the interconnected busbars 2. There is a packaging bonding layer 3-3 between the grid line supporting layer 3-2 and a packaging structure on the same side, for bonding the grid line supporting layer 3-2 and the packaging structure on the same side together.

Compared with Embodiment 1, the difference lies in that: as shown in FIG. 17, with respect to the smallest covered unit such as a photovoltaic cell 1, the grid line supporting layer 3-2 is a whole film, and the grid line bonding layer 3-1 is in the form of film strips. Gaps exist between the interconnected busbars 2 and the grid line bonding layer 3-1. Because there are gaps between the interconnected busbars 2 and the grid line bonding layer 3-1, it is not excluded that the thickness of the grid line bonding layer 3-1 may be slightly larger than the thickness of the interconnected busbars 2 before the module is laminated. After lamination, the grid line bonding layer 3-1 is thinned due to compression.

Figure 18:
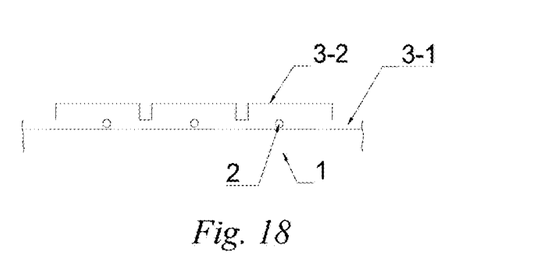
FIG. 18 is schematic diagram of a second stacked structure, which is not laminated, for fixing interconnected busbars according to Embodiment 13 of the present invention.
Figure 19:
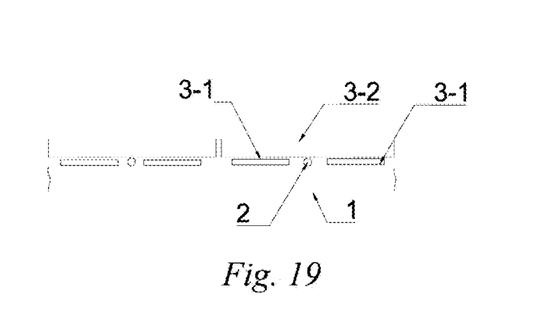
FIG. 19 is schematic diagram of a third stacked structure, which is not laminated, for fixing interconnected busbars according to Embodiment 13 of the present invention.

Of course, the difference may also lie in that: as shown in FIG. 18, the grid line supporting layer 3-2 is in the form of film strips, and the grid line bonding layer 3-1 is a whole film; or, as shown in FIG. 19, both the grid line bonding layer 3-1 and the grid line supporting layer 3-2 are in the form of film strips.

Figure 20:
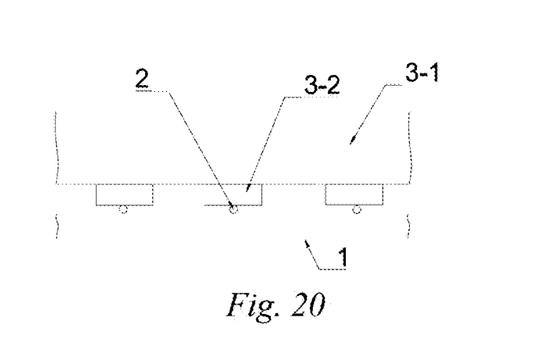
FIG. 20 is schematic diagram of a stacked structure, which is not laminated, for fixing interconnected busbars according to Embodiment 14 of the present invention.

Embodiment 14, compared with Embodiment 13, is different in that: as shown in FIG. 20, the grid line supporting layer 3-2 is located between the grid line bonding layer 3-1 and the photovoltaic cell 1, the grid line supporting layer 3-2 shields the grid line bonding layer 3-1 only in local areas, and shielded areas and non-shielded areas of the grid line bonding layer 3-1 shielded by the grid line supporting layer 3-2 are respectively bonded with the grid line supporting layer 3-2 and the photovoltaic cell 1 for adhering of the grid line supporting layer 3-2 to the surface of the photovoltaic cell 1.

In FIG. 20, with respect to the smallest covered unit such as the photovoltaic cell 1, the grid line supporting layer 3-2 is in the form of film strips, the grid line bonding layer 3-1 is a whole film, and the grid line bonding layer 3-1 may be exactly the packaging bonding layer 3-3. The structure of a photovoltaic cell module includes a packaging panel 5, a grid line bonding layer 3-1, a grid line supporting layer 3-2, a photovoltaic cell layer, a grid line supporting layer 3-2, a grid line bonding layer 3-1, and a packaging backplane 6.

Of course, the following may also be possible: the grid line supporting layer 3-2 and the grid line bonding layer 3-1 are both whole films, the grid line supporting layer 3-2 has hollows, and the area, shape and distribution density of the hollowed areas may be designed arbitrarily under the condition of ensuring the package quality of the module and the reliable fixation of the interconnected busbars 2.

The invention claimed is:

1. A photovoltaic cell module, comprising a photovoltaic cell layer, wherein photovoltaic cells in the photovoltaic cell layer derive a current through interconnected busbars, wherein: there is linear contact between surfaces of the interconnected busbars and surfaces of the photovoltaic cells, there are multiple pads on the photovoltaic cells, and there are multiple connection points formed by heating the pads and used for preliminarily fixing the interconnected busbars between the interconnected busbars and the photovoltaic cells, a grid line bonding layer and a grid line supporting layer are provided on the surfaces of the photovoltaic cells for completely fixing the interconnected busbars to the surfaces of the photovoltaic cells, and the interconnected busbars are embedded in the grid line bonding layer, and the grid line supporting layer adheres to the surfaces of the photovoltaic cells by a bonding effect of the grid line bonding layer, and the grid line supporting layer is laminated on the interconnected busbars;

wherein: the grid line supporting layer is located between the grid line bonding layer and the photovoltaic cells, the grid line supporting layer shields the grid line bonding layer only in local areas, and shielded areas and non-shielded areas of the grid line bonding layer shielded by the grid line supporting layer are respectively bonded with the grid line supporting layer and the photovoltaic cells for adhering of the grid line supporting layer to the surface of the photovoltaic cells.

2. The photovoltaic cell module of claim 1, wherein: the grid line bonding layer is located between the grid line supporting layer and the photovoltaic cells for adhering of the grid line supporting layer to the surfaces of the photovoltaic cells, and a thickness of the grid line bonding layer is smaller than thicknesses of the interconnected busbars.

3. The photovoltaic cell module of claim 2, further comprising a packaging structure, wherein the photovoltaic cell layer is packaged in the packaging structure, the grid line bonding layer and the grid line supporting layer cover the interconnected busbars on the surfaces of the photovoltaic cells, the surfaces of the interconnected busbars come into contacts with the surface of the photovoltaic cells by melted low melting-point welding layers; and there is a packaging bonding layer between the grid line supporting layer and a packaging structure on a same side, for bonding the grid line supporting layer and the packaging structure on the same side together.

4. The photovoltaic cell module of claim 2, wherein: with respect to a smallest covered unit, both the grid line supporting layer and the grid line bonding layer are whole films; or, the grid line supporting layer is a whole film and the grid line bonding layer is film strips; or, the grid line supporting layer is film strips and the grid line bonding layer is a whole film; or, both the grid line bonding layer and the grid line supporting layer are film strips.

5. The photovoltaic cell module of claim 2, wherein: the grid line bonding layer and the grid line supporting layer are in the form of composite film strips containing a grid line bonding layer and a grid line supporting layer, at least one photovoltaic cell is taken as a smallest covered unit, and the composite film strips extend along a first direction and are arranged at intervals along a second direction; or, the composite film strips extend along the second direction and are arranged at intervals along the first direction, wherein the first direction is an extension direction of the interconnected busbars, and the second direction is perpendicular to the extension direction of the interconnected busbars.

6. The photovoltaic cell module of claim 1, wherein: the grid line supporting layer and the grid line bonding layer are made of polymer materials, wherein the grid line supporting layer is PET, EVA, POE, PVB, PVF, PMMA or PC, the grid line bonding layer is silica gel, POE, EVA, TPU or liquid silica gel, the photovoltaic cells are busbarless photovoltaic cells, and the interconnected busbars are multi-busbar welding strips.

7. The photovoltaic cell module of claim 1, wherein: with respect to a smallest covered unit, the grid line supporting layer and the grid line bonding layer are both whole films, and the grid line supporting layer has hollows; or, the grid line supporting layer is film strips, and the grid line bonding layer is a whole film.

8. The photovoltaic cell module of claim 1, wherein: the interconnected busbars are in electrical contact with the photovoltaic cells via welding layers or conductive adhesive, and the welding layers are low melting-point welding layers with melting temperatures lower than a lamination temperature of the module.

9. A method of manufacturing the photovoltaic cell module of claim 1, further comprising the following steps: firstly, preliminarily fixing interconnected busbars on surfaces of the photovoltaic cells via conductive or non-conductive connection points; and then covering the surfaces of the photovoltaic cells with a grid line supporting layer and a grid line bonding layer, applying pressure on the grid line supporting layer and the grid line bonding layer, and completely fixing the interconnected busbars to the surfaces of the photovoltaic cells by means of the grid line supporting layer.

10. The method of manufacturing the photovoltaic cell module of claim 9, further sequentially comprising a photovoltaic cell string fabrication step and a module lamination step, wherein in the photovoltaic cell string fabrication step, the interconnected busbars are preliminarily fixed to the surfaces of the photovoltaic cells via conductive or non-conductive connection points, in the module lamination step, lamination pressures applied on the grid line supporting layer and the grid line bonding layer make the interconnected busbars to be completely fixed to the surfaces of the photovoltaic cells by means of the grid line supporting layer, and in the module lamination step, the interconnected busbars are brought into electrical contact with the photovoltaic cells.

11. The method of manufacturing the photovoltaic cell module of claim 9, wherein:
the grid line bonding layer and the grid line supporting layer are used for covering in sequence in the form of films, respectively;
or, the grid line bonding layer and the grid line supporting layer are used for covering in the form of composite films containing the grid line bonding layer and the grid line supporting layer;
or, the grid line bonding layer and the grid line supporting layer are used for covering in the form of composite film strips containing a grid line bonding layer and a grid line supporting layer;
or, the grid line supporting layer in the form of a film and the grid line bonding layer in a liquid form are used for covering in sequence.

12. The method of manufacturing the photovoltaic cell module of claim 9, wherein: connection points between the interconnected busbars and the photovoltaic cells are formed by welding or bonding.

13. A method of manufacturing the photovoltaic cell module of claim 1, wherein: firstly, fabricating a photovoltaic cell string, so that interconnected busbars of the photovoltaic cell string are preliminarily fixed to surfaces of the photovoltaic cells via conductive or non-conductive connection points; then, covering the interconnected busbars on the surfaces of the photovoltaic cells with a grid line bonding layer and a grid line supporting layer, wherein the grid line bonding layer is located between the grid line supporting layer and the photovoltaic cells; and finally, packaging, with a module lamination process, the photovoltaic cells in a packaging structure of the photovoltaic module, and completely fixing the interconnected busbars to the surfaces of the photovoltaic cells by means of the grid line bonding layer and the grid line supporting layer, wherein
the grid line supporting layer is bonded to the surfaces of the photovoltaic cells by means of the grid line bonding layer, a thickness of the grid line bonding layer is smaller than thicknesses of the interconnected busbars, the grid line bonding layer is heated to flow by the module lamination process, so that the interconnected busbars are embedded in the grid line bonding layer, and the grid line supporting layer is laminated on the interconnected busbars, and
surfaces of the interconnected busbars have low melting-point welding layers, which are melted at a lamination temperature to form electrical contacts with the surfaces of the photovoltaic cells.

14. The method of manufacturing the photovoltaic cell module of claim 13, further sequentially comprising a photovoltaic cell string fabrication step, a module arrangement step and a module lamination step, wherein
the grid line bonding layer and the grid line supporting layer adhere to a surface of the photovoltaic cell string by taking the photovoltaic cell string as a smallest covered unit and in the form of composite film strips containing a grid line bonding layer and a grid line supporting layer, and the composite film strips extend along a first direction and are arranged at intervals along a second direction on a surface of the photovoltaic cell string, wherein the first direction is an extension direction of the interconnected busbars, and the second direction is perpendicular to the extension direction of the interconnected busbars, and arrangement is performed on the photovoltaic cell string adhered with the composite film strips in the module arrangement step.

15. The method of manufacturing the photovoltaic cell module of claim 13, further sequentially comprising a photovoltaic cell string fabrication step, a photovoltaic cell string arrangement step, a module arrangement step and a module lamination step, wherein
in the photovoltaic cell string arrangement step, the photovoltaic cell string is arranged in a photovoltaic cell layer as a whole according to module specifications and requirements, the grid line bonding layer and the grid line supporting layer adhere to a surface of the photovoltaic cell layer by taking the photovoltaic cell layer as a smallest covered unit and in the form of composite film strips containing a grid line bonding layer and a grid line supporting layer, and the composite film strips extend along a second direction and are arranged at intervals along a first direction on the surface of the photovoltaic cell layer, wherein the first direction is an extension direction of the interconnected busbars, and the second direction is perpendicular to the extension direction of the interconnected busbars, and module arrangement is performed on the photovoltaic cell layer adhered with the composite film strips in the module arrangement step.

16. The method of manufacturing the photovoltaic cell module of claim 13, wherein: the grid line bonding layer and the grid line supporting layer are used for covering in the form of composite film containing a grid line bonding layer and a grid line supporting layer, and the composite film is a three-layer composite structure including a packaging bonding layer, the grid line supporting layer and the grid line bonding layer, wherein the packaging bonding layer is used for bonding the grid line supporting layer with a packaging structure on the same side, and the packaging bonding layer and the grid line bonding layer are located on the front and back sides of the grid line supporting layer, respectively.

* * * * *